(12) United States Patent
Mayer et al.

(10) Patent No.: US 11,184,204 B2
(45) Date of Patent: Nov. 23, 2021

(54) PRE-DISTORTION CIRCUIT, APPARATUS, METHOD AND COMPUTER PROGRAM FOR PRE-DISTORTING, TRANSMITTER, RADIO TRANSCEIVER, MOBILE TRANSCEIVER, BASE STATION TRANSCEIVER, COMMUNICATION DEVICE, STORAGE

(71) Applicant: Apple Inc., Cupertino, CA (US)

(72) Inventors: Christian Mayer, Wilhering (AT); Jan Zaleski, Altenberg bel Linz (AT); Jovan Markovic, Linz (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/095,977

(22) PCT Filed: Jul. 1, 2016

(86) PCT No.: PCT/IB2016/053984
§ 371 (c)(1),
(2) Date: Oct. 24, 2018

(87) PCT Pub. No.: WO2018/002694
PCT Pub. Date: Jan. 4, 2018

(65) Prior Publication Data
US 2021/0144036 A1  May 13, 2021

(51) Int. Cl.
| | |
|---|---|
| *H04L 27/00* | (2006.01) |
| *H04L 27/20* | (2006.01) |
| *H03M 1/66* | (2006.01) |
| *H04L 27/36* | (2006.01) |

(52) U.S. Cl.
CPC .......... *H04L 27/2092* (2013.01); *H03M 1/66* (2013.01); *H04L 27/364* (2013.01); *H04L 27/365* (2013.01)

(58) Field of Classification Search
CPC ... H04L 27/00; H04L 27/2092; H04L 27/364; H04L 27/365; H03M 1/66
USPC ........................................ 375/295, 296, 297
See application file for complete search history.

(56) References Cited

U.S. PATENT DOCUMENTS

| | | |
|---|---|---|
| 6,314,142 B1 | 11/2001 | Perthold et al. |
| 2002/0080891 A1 | 6/2002 | Ahn et al. |
| 2005/0111574 A1 | 5/2005 | Muller et al. |
| 2005/0163205 A1 | 7/2005 | Mccallister |
| 2009/0021320 A1* | 1/2009 | De Jong ................. H03F 3/189 332/109 |

(Continued)

*Primary Examiner* — Siu M Lee
(74) *Attorney, Agent, or Firm* — Kowert, Hood, Munyon, Rankin & Goetzel, P.C.

(57) ABSTRACT

Embodiments provide a pre-distortion circuit and apparatus, a method and computer program for pre-distorting, a transmitter, a radio transceiver, a communication device, a mobile transceiver, a base station transceiver and a storage. The pre-distortion circuit (10) is configured for a digital quadrature signal. The pre-distortion circuit (10) comprises a first input (12) for an inphase component of the quadrature signal and a second input (14) for a quadrature component of the quadrature signal. The pre-distortion circuit 10 comprises a signal processing circuit (16) configured to determine whether polarities of the inphase component and quadrature component are equal, and to determine pre-distortion coefficients based on the amplitude of the inphase component, the amplitude of the quadrature component, and based on whether the polarities are equal.

25 Claims, 8 Drawing Sheets

FIG. 6

(56) References Cited

U.S. PATENT DOCUMENTS

2013/0033317 A1    2/2013   Hawkes
2014/0146917 A1*   5/2014   Muhammad ......... H04B 1/0475
                                                    375/297

* cited by examiner

PRE-DISTORTION CIRCUIT, APPARATUS, METHOD AND COMPUTER PROGRAM FOR PRE-DISTORTING, TRANSMITTER, RADIO TRANSCEIVER, MOBILE TRANSCEIVER, BASE STATION TRANSCEIVER, COMMUNICATION DEVICE, STORAGE

FIELD

Examples relate to pre-distortion of components of a quadrature signal and in particular, but not exclusively, to pre-distortion of the components of a quadrature signal before radiofrequency digital-to-analog-conversion in a transmitter.

BACKGROUND

Digital communication systems are well established. Data applications have been available for many years and with the developing standard for cellular systems digital communication becomes more important. At some point in a transmitter digital signals are converted into analog signals before the analog signals are transmitted at Radio Frequency (RF). Digital-to-analog conversion is a component in the communication chain. It is used to translate or convert signals from a digital domain to an analog domain before the signals can be transmitted over an antenna. Recent developments in the field of digital-to-analog conversion have brought Radio-Frequency-Digital-to-Analog-Converters (RFDAC), in some literature also known as Direct-Digital-DAC. An RFDAC combines functionalities of a digital-to-analog converter and a mixer into a single component, and since it allows highly integrated implementation with reduced size and utilization of advantages of digital circuits, it is already used by some devices.

There are many implementation possibilities of RFDACs, such as current-DAC (or I-DAC), or resistance-DAC (or R-DAC), and capacitive-DAC (or C-DAC). Because of its advantages compared to others, C-DAC may be preferable in some products.

BRIEF DESCRIPTION OF THE FIGURES

Some examples of circuits, apparatuses, transmitters, methods, computer programs, etc. will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

Figure 1:
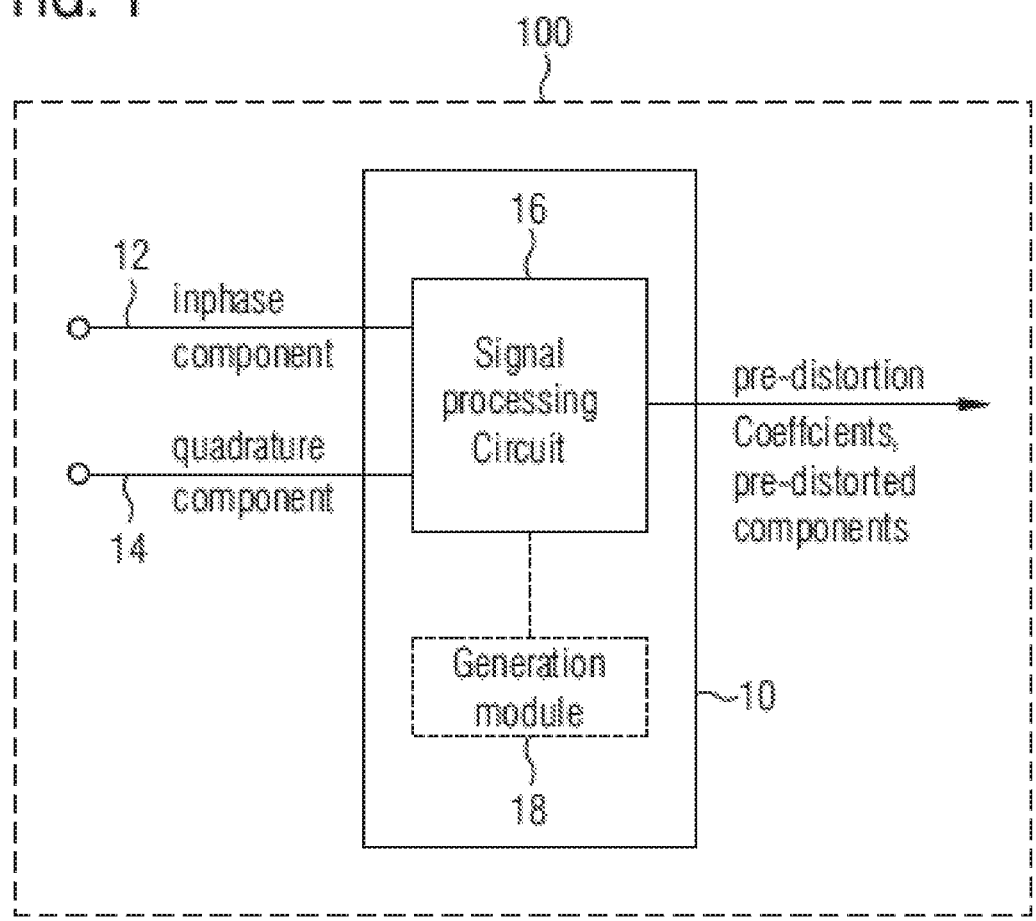
FIG. 1 illustrates an example of a pre-distortion circuit and an example of a pre-distortion apparatus.

"In the following some examples will be described. FIG. 1 illustrates an example of a pre-distortion circuit/apparatus 10. More specifically, FIG. 1 shows a pre-distortion circuit/apparatus 10 for a digital quadrature signal. The pre-distortion circuit/apparatus 10 comprises a first input 12 for an inphase component of the quadrature signal and a second input 14 for a quadrature component of the quadrature signal. The first and second inputs 12, 14 are coupled to a signal processing circuit/means 16. The signal processing circuit/means 16 is configured to determine the signs of the inphase component and of the quadrature component. The signal processing circuit/means 16 is further configured to determine pre-distortion coefficients based on the amplitude of the inphase component, the amplitude of the quadrature component, and based on the signs of the inphase component and the quadrature component. The pre-distortion coefficients may then be used to modify the inphase and quadrature components to obtain pre-distorted versions of the inphase signal and the quadrature signal."

"In the following further examples will be described and implementation details for components of the pre-distortion circuit/apparatus 10. Regarding such details, various "module" and "circuit" features may equally correspond to respective "means" features, even when explicit repetition, e.g. of "circuit/apparatus" or "circuit/means", is omitted in favor of a single designation, e.g. of "circuit", "apparatus" or "means".".

In examples the first and second inputs 12 and 14 may be implemented as contacts, pins or input registers that allow providing the corresponding signals to the processing circuit 16.

The inphase and quadrature component may be digital signals and the signal processing circuit 16 may be correspondingly configured. The signal processing circuit 16 may comprise digital components. In examples signal processing circuit 16 may be implemented using one or more processing units, one or more processing devices, any means for processing, such as a processor, a computer or a programmable hardware component being operable with accordingly adapted software. In other words, the described function of signal processing circuit 16 may as well partly or completely be implemented in software, which is then executed on one or more programmable hardware components. Such hardware components may comprise a general purpose processor, a Digital Signal Processor (DSP), a microcontroller, etc. In examples the signal processing circuit 16 may comprise logical components, such as logical gates, switches, multiplexers, registers, arithmetic logic units, etc.

In some examples the signs of the inphase component and the quadrature component are explicitly determined, such that four combinations of the signs are possible. The signal processing circuit 16 may be configured to determine whether polarities of the inphase component (I) and quadrature component (Q) are equal to 1 or to −1. This way, examples may provide the possibility to distinguish four different cases,
1. sign (I)=1, sign(Q)=1;
2. sign (I)=−1, sign(Q)=1;
3. sign (I)=1, sign(Q)=−1; and
4. sign (I)=−1, sign(Q)=−1.

For each of these cases the amplitudes of the respective components may be used differently in order to determine the pre-distortion coefficients. Some examples may use one or more functional relations between the signs, the amplitudes of the components and the pre-distortion coefficients. Other examples may use Look-Up Tables (LUT) with corresponding mappings between pre-distortion coefficients and amplitudes as will be detailed subsequently. For example, four LUTs may be distinguished for the four cases as set out above. Examples may cover cases where this pre-distortion can be implemented according to the possibilities of sign(I) and sign(Q). In case of a symmetric behavior (same behavior for cases 1 and 4, and for cases 2 and 3), equality of the signs or polarities of the signal components may be determined. In a general example the signs of I and Q are evaluated, and based on the evaluation the coefficients are determined based on the signs of I and Q.

"As further indicated in FIG. 1 in some examples the signal processing circuit 16 may be configured to determine a pre-distorted version of the inphase component and a pre-distorted version of the quadrature component. For example, the pre-distorted version of the inphase component may be an addition of the inphase component and the quadrature component weighted with the pre-distortion coefficient. The pre-distorted version of the quadrature component may be an addition of the quadrature component and the inphase component weighted with the pre-distortion coefficient. Examples also provide a transmitter 100 comprising the pre-distortion circuit/apparatus 10."

In an example an RFDAC, which is comprised in a transmitter, is configured for converting a base band signal to an analog radio frequency signal based an output signal (e.g. predistorted version of the inphase and quadrature components) of the pre-distortion circuit 10. For example, a C-DAC may be used. C-DAC may have intrinsic Amplitude Modulation (AM) and Phase Modulation (PM) effects, depending on a number of currently turned on cells (AM) and a cell switching delay (corresponding to phase offset or PM) changes. Such an effect may be decreased for a polar architecture C-DAC using standard AMPM predistortion. In case a quadrature signal is represented using quadrature (Q) and inphase (I) components standard AMPM pre-distortion may be non-optimal due to IQ cross-effects. Examples may use a low complexity AMPM pre-distortion for IQ C-DAC. Using a multidimensional Digital Pre-Distortion (DPD), e.g. 2-dimensional DPD, may result in a signal processing task.

The phase error may depend on a number of currently turned on cells, which corresponds to the input amplitude of the C-DAC (the higher the input amplitude of the C-DAC the more cells are turned on or activated). In general an RFDAC may comprise a serial or a parallel structure of similar sub-structures, which are also referred to as cells. Such a sub-structure may comprise one or more transistors, capacitors, resistors, inductors, etc. For example, there is a total number of N cells, and each cell can be activated or de-activated, e.g. using a transistor. For example, cells are activated until a certain input amplitude is matched (exceeded), capacitors or inductors (low pass filters in general) may then be used to eliminate sharp edges and to obtain an analog output signal. Such components may as well be comprised in a matching network of the RFDAC. The more sub-structures are activated the higher an influence of gate capacities, for example.

On the one hand, the complexity in IQ is that the number of "currently turned on cells" seen by I or Q during switching varies depending on I&Q signs (whether their polarities are equal or different), and can be equal to |I|, |Q| or |I|+|Q|. On the other hand, a relationship of the number of "currently turned on cells" or amplitude and the PM is quite stable and well characterized. The basic principle of the pre-distortion in some examples is to define or determine which condition applies to I and Q for the given signs, to define a low complex mechanism for AMPM pre-distortion of an IQ modulator, and to pre-distort I and Q separately using at least one 1-dimensional DPD Look-up table (LUT). In general, LUTs may be distinguished according to the four combinations (cases pointed out above) of the signs of I and Q. For example, a linear approximation of AMPM distortion can be used. As further shown in FIG. 1 the pre-distortion circuit 10 may further comprise a generation module 18 configured to generate the pre-distortion coefficients. Such generation may be based on a functional relation between the pre-distortion coefficients and the amplitudes of I and Q, the signs of I and Q, respectively. Some examples may distinguish different functional relations for different combinations of the signs of I and Q. In some examples the pre-distortion coefficients may be calculated instead of using a LUT. In a general example, the generation module 18 may use the signs and amplitudes of I and Q as input parameters and outputs the pre-distortion coefficients. Using one or more LUTs is just an example for an efficient hardware implementation of the generation module 18. The generation module 18 may be implemented as a storage module configured to store at least one one-dimensional look-up table.

The storage module is an optional component. In examples such a memory or storage may be a flash memory, a volatile- or non-volatile memory, Random Access Memory (RAM), Dynamic RAM (DRAM), Static RAM (SRAM), or any kind of memory.

Comparing to 2D look-up tables, examples may provide lower complexity, smaller area and lower power consumption. The reason can be seen in the following example. If a suppression of a third order nonlinearity is needed, the following polynomial may be generated:

$$I_{pred} = \alpha_1 I + \alpha_2 Q + \alpha_3 IQ + \alpha_4 I_2 + \alpha_5 Q^2 + \alpha_6 I^2 Q + \alpha_7 IQ^2 + \alpha_8 I^3 + \alpha_9 Q^3,$$

$$Q_{pred} = \beta_1 I + \beta_2 Q + \beta_3 IQ + \beta_4 I^2 + \beta_5 Q^2 + \beta_6 I^2 Q + \beta_7 IQ^2 + \beta_8 I^3 + \beta_9 Q^3.$$

which means approximately 40 multipliers, 18 adders and 18 coefficients. All these coefficients need to be calculated from the 2D LUT. For the higher order nonlinearity the complexity increases almost exponentially. Such solutions might not be likely to be implemented since they may reach limitations in complexity, area and power consumption.

Examples may offer lower complexity and lower effort for implementation since the following terms may be generated:

$$I_{pred} = I + \alpha_Q Q$$

$$Q_{pred} = -\alpha_I I + Q$$

Thus, some examples may need 3 adders and two multiplications. Two coefficients are calculated using a 1D LUT in some examples. The at least one look-up table may comprise a mapping between amplitude values and pre-distortion coefficients or the at least one lookup table may comprise a mapping between a number of activated cells in a radio-frequency-digital-to-analog converter and pre-distortion coefficients. The radio-frequency-digital-to-analog converter is configured to convert the inphase component and/or the quadrature component.

Figure 2:
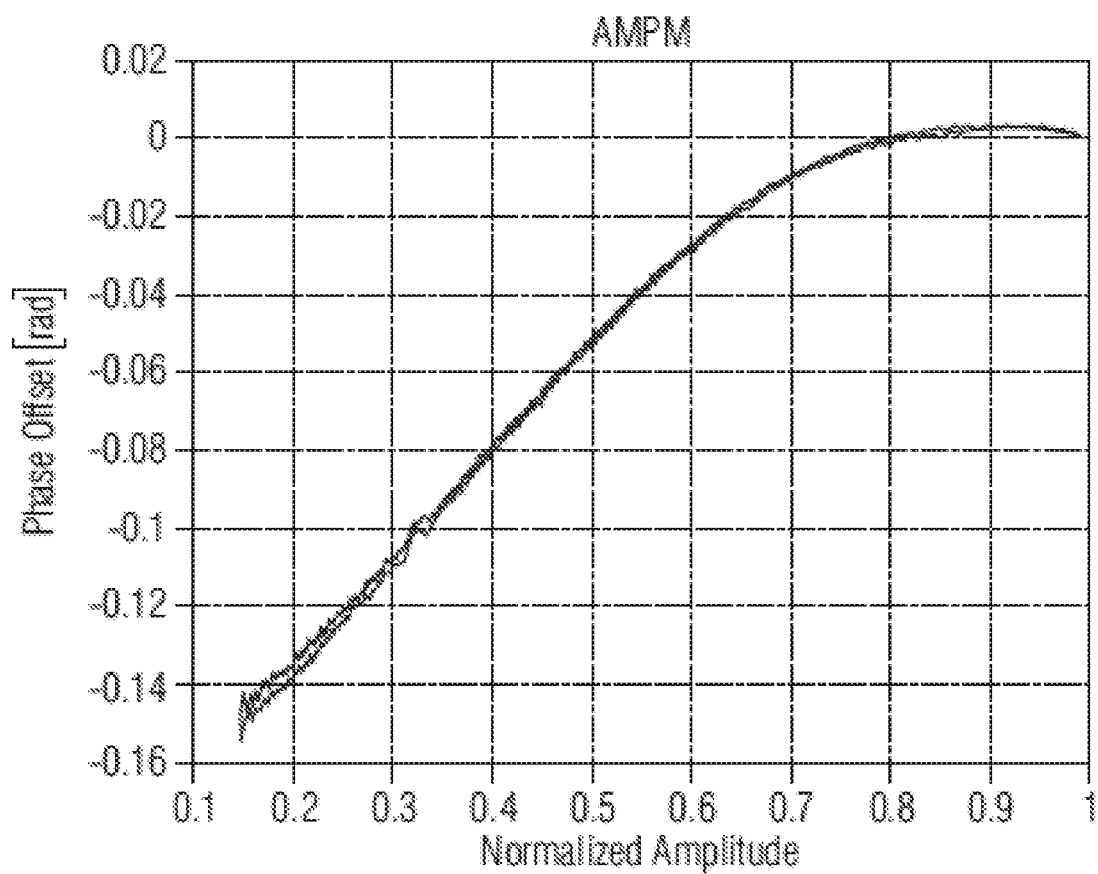
FIG. 2 illustrates a phase to amplitude relation of a C-DAC in an example.

Examples may be further based on the finding that the phase offset is related to the ratio of the turned on and off cells of a C-DAC. FIG. 2 illustrates a phase to amplitude relation of a C-DAC in an example. FIG. 2 shows a typical AMPM measurement for a polar modulator. The abscissa represents the normalized input amplitude, which is directly related to the number of turned on cells and the ordinate represents the phase offset. Cells of the C-DAC are switched on and off according to: 1) the input amplitude and 2) LO signal. Input amplitude determines how many cells are needed to represent given amplitude (or I/Q) and the LO signals are used to modulate a given amplitude. This means when the LO signal equals 1 the cells are turned on, and when the LO signal equals zero cells are switched off.

Figure 3:
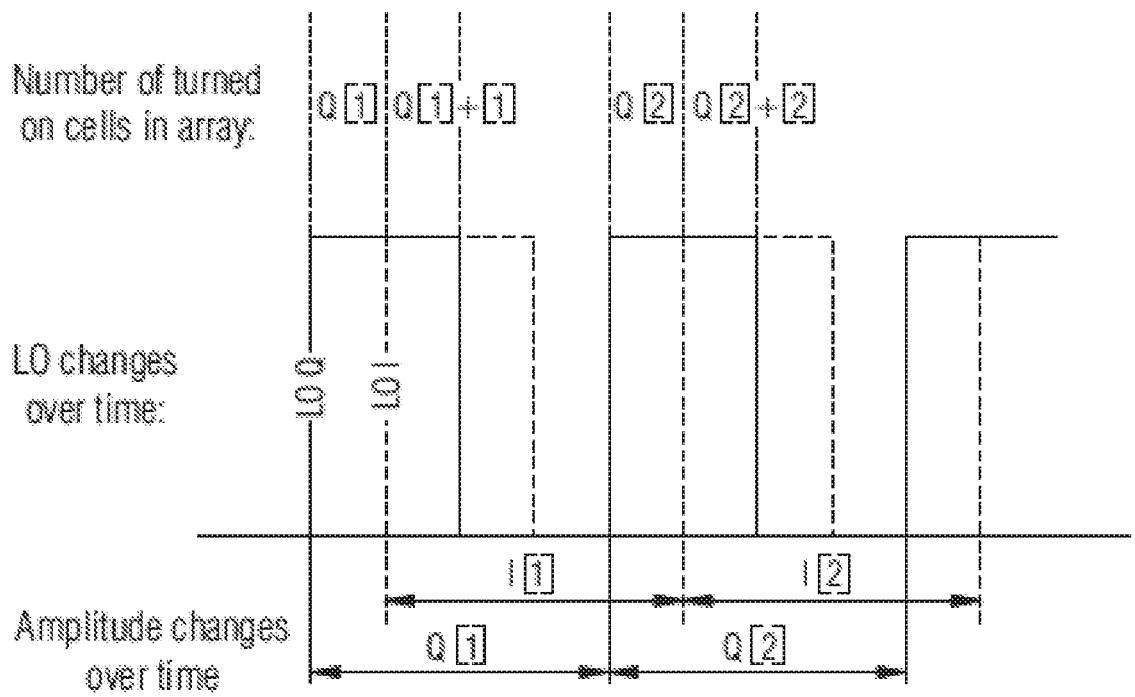
FIG. 3 shows a local oscillator signal timing for a quadrature signal in an example.
Figure 4:
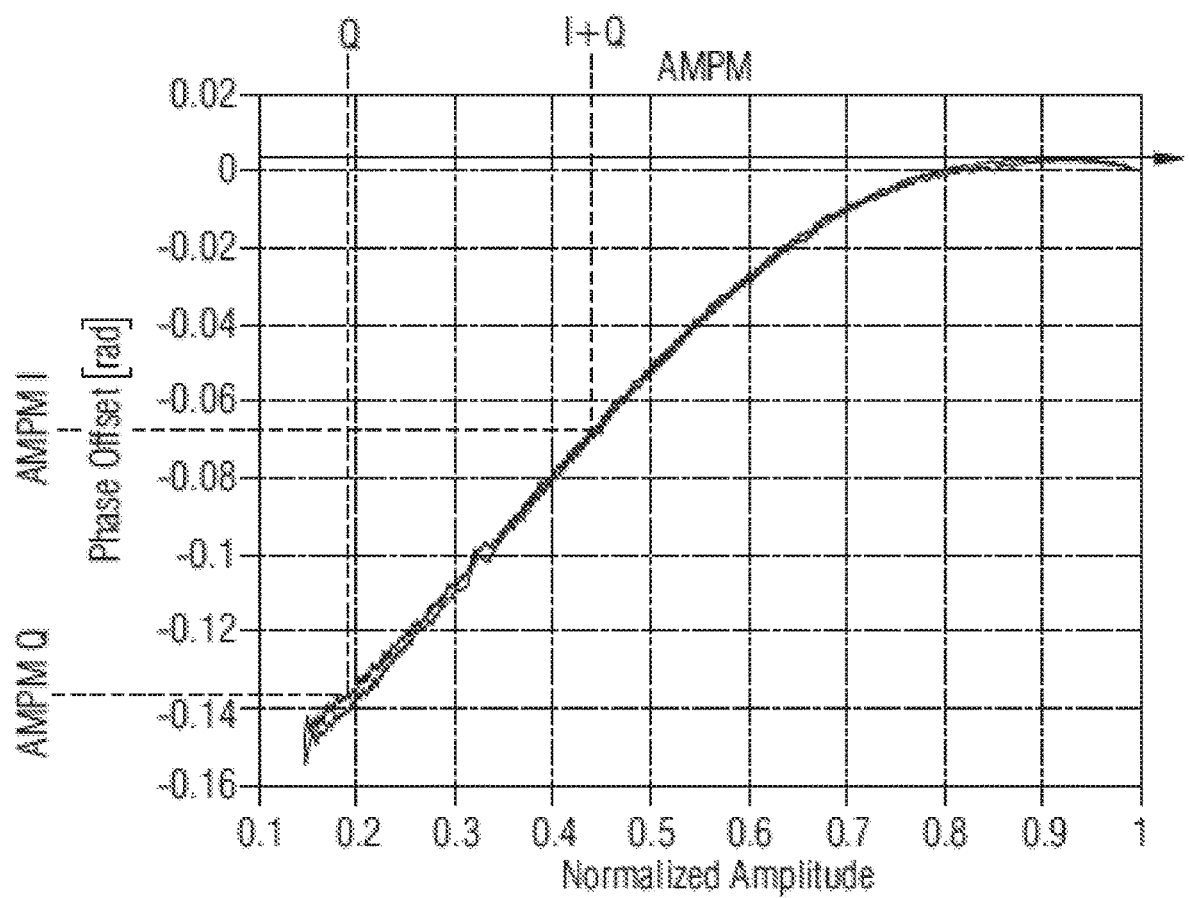
FIG. 4 illustrates a phase offset calculation for IQ C-DAC in an example.

FIG. 3 shows a local oscillator signal timing for a quadrature signal in an example. FIG. 3 shows time changes of the LO signals in I (broken or dashed line) and (solid line) Q and corresponding amplitude changes. FIG. 3 shows the inphase and quadrature components of the LO signals. These are the LO signals, the above described inphase and quadrature components get mixed with, for example, in an RFDAC. The timing can be sub-divided in four equidistant periods each having a quarter duration of the LO period. In the first period LO Q=1 and LO I=0, in the second period LO Q=1 and LO I=1, in the third period LO Q=0 and LO I=1, and the fourth period LO Q=0 and LO 1=0. FIG. 3 illustrates the situation when the polarities of I (inphase component) and Q (quadrature component) are equal, hence LO Q has the first rising edge. If they differ, the situation is mirrored and LO I has the first rising edge. This means, when I and Q have the same sign, the LO Q signal changes to 1 during the first time slot, while the LO I is 0. Thus the Q signal "sees" the whole array of cells turned off, and the generated phase offset corresponds to the amplitude in Q. After a quarter of the LO period the LO I changes to 1. I signal now "sees" Q cells that are turned on and N-Q cells that are off (where N is the total number of cells of the C-DAC). Thus the generated phase offset of the I signal corresponds to the (|I|+|Q|) amplitude. This situation is further illustrated FIG. 4. FIG. 4 illustrates a phase offset calculation for IQ C-DAC in an example. The illustration of FIG. 4 is similar to the illustration of FIG. 2. During the second period AMPM is determined based on |I|+|Q|.

This applies when the signs of the I and Q signals are equal. Otherwise the LO I signal starts a quarter of the LO period before LO Q. For this reason examples may use for both I and Q a 1D LUT that describes AMPM behavior of the C-DAC, for the case of equal signs input |I|+|Q| and |Q|, and if the signs are not equal examples may use |I| and |I|+|Q|. Hence, in some examples the signal processing circuit 16 may be configured to determine the predistortion coefficients from the at least one look-up table based on a magnitude of the quadrature component and based on a sum of magnitudes of the quadrature component and the inphase component. The signal processing circuit 16 may be configured to determine the pre-distortion coefficients from the at least one look-up table based on a magnitude of the inphase component and based on a sum of magnitudes of the quadrature component and the inphase component.

Figure 5:
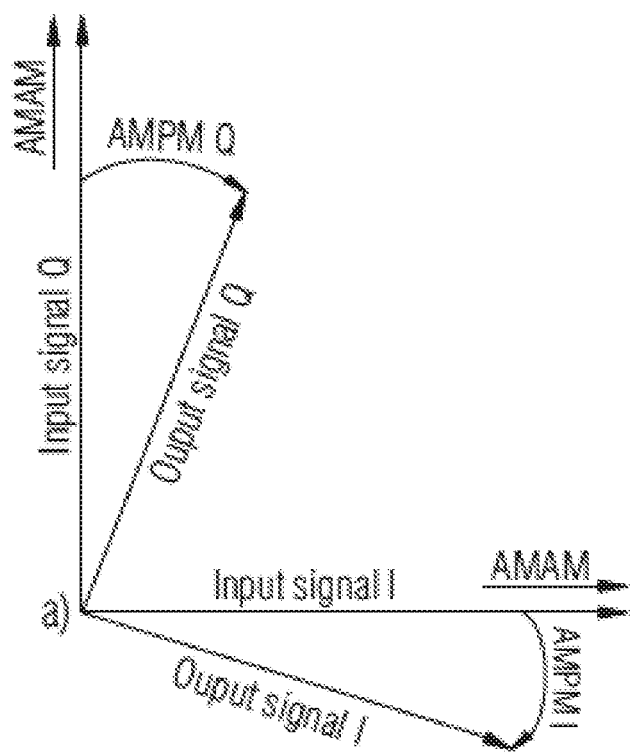
FIG. 5 shows IQ and polar representations of distorted signals in an example.
Figure 5:
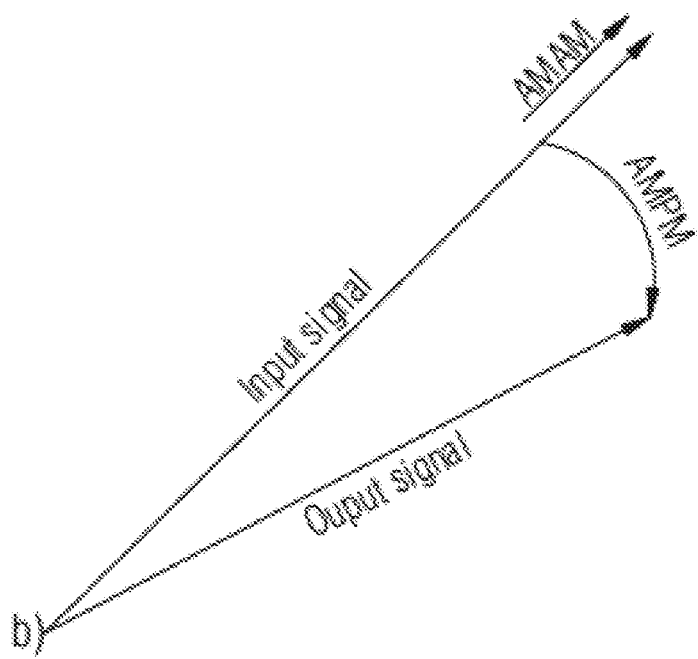

As the phase offset is defined therewith the next step is to define the pre-distortion procedure of the IQ modulator. Both amplitudes generate phase offsets, see FIG. 4. FIG. 5 shows IQ and polar representations of distorted signals in an example. FIG. 5 shows an AMPM and AMAM representation for an IQ transmitter on the left and for a polar transmitter on the right. Both representations are vector representations in the complex plane. As shown on the left, the input signal Q experiences AMAM, AMPM and gets distorted to the output signal Q. Similar distortion applies to the input signal I and the distorted output signal I Likewise the distortion modified the polar input signal (shown on the right) to a distorted output signal.

As represented in FIG. 5, there is a connection between the polar and the IQ transmitter, such that AMAM and AMPM for IQ are as if there were two polar vectors that work together and are orthogonal to each other. In the IQ modulation all signals that need to be transmitted are represented as linear combination of the two basis vectors, which are orthogonal to each other. AMPM offset can be now defined as change of the basis, where base vectors are multiplied with a rotational matrix. Both I and Q experience phase offsets that are not necessarily equal. As a result a new basis with the base vectors I' and Q' can be obtained whose difference is not 90° anymore, i.e. I and Q are no longer orthogonal meaning that IQ cross talk is created. Expressed in equations this yields:

$$\begin{bmatrix} I' \\ Q' \end{bmatrix} = \begin{bmatrix} \cos(\alpha_I) & \sin(\alpha_Q) \\ -\sin(\alpha_I) & \cos(\alpha_Q) \end{bmatrix} \begin{bmatrix} I \\ Q \end{bmatrix}, \text{ or}$$

$$\begin{bmatrix} I' \\ Q' \end{bmatrix} = H_{non} \begin{bmatrix} I \\ Q \end{bmatrix},$$

where $\alpha_I$ and $\alpha_Q$ are the AMPM phase offsets in I and Q respectively, and $H_{non}$ is the rotational matrix used for the basis transformation. This represents a finding of examples, namely the pre-distortion for IQ is a reciprocal rotational matrix:

$$H_{pred} = H_{non}^{-1} = \begin{bmatrix} \cos(\alpha_I) & \sin(\alpha_Q) \\ -\sin(\alpha_I) & \cos(\alpha_Q) \end{bmatrix}^{-1}.$$

This relation can be simplified. First, if small angles are assumed, which is generally true, then the cosine is approximately equal to 1 and the sine is approximately equal to the given angle. Second, another simplification is related to the fact that for the basis transformation the rotational matrix has been used. Thus to avoid matrix inversion negative angles could be used. So a further approximation can be defined as $$H_{pred} = \begin{bmatrix} 1 & \alpha_Q \\ -\alpha_I & 1 \end{bmatrix}.$$

In some examples, the at least one look-up table may comprise an approximation of a rotation of a polar representation of the quadrature signal to the inphase and quadrature components. The at least one look-up table may comprises an approximation assuming non-orthogonal rotations of the polar representation to obtain the inphase and quadrature components. The approximation may be linear.

Figure 6:
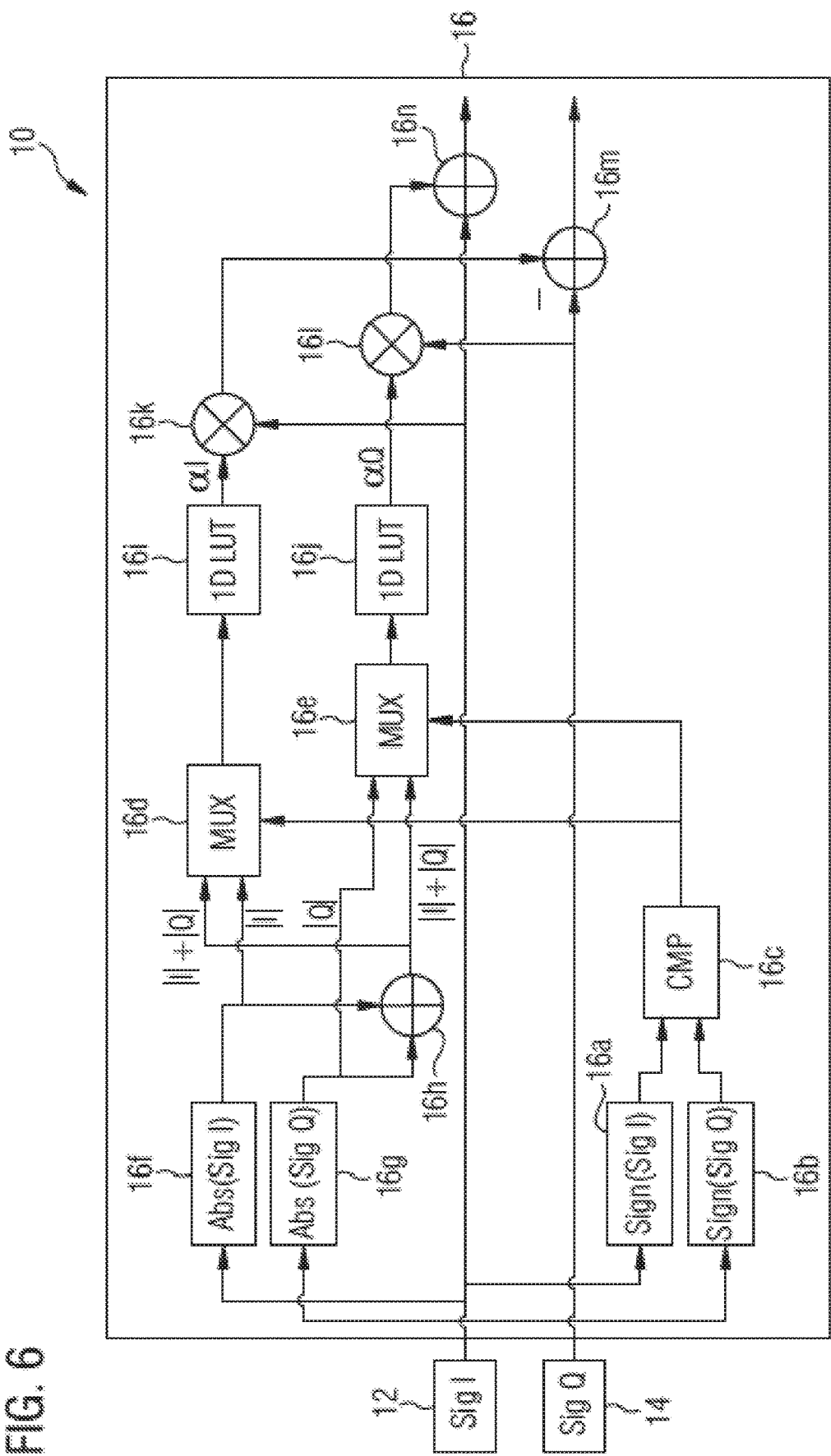
FIG. 6 shows a circuit diagram of an implementation of an example.

"FIG. 6 shows a circuit diagram of an implementation of an example of a pre-distortion circuit/apparatus 10. FIG. 6 shows on the left hand side an input 12 for the inphase component Sig I and an input 14 for the quadrature component Sig Q. In the following details of the signal processing circuit 16 in the example will be described. The signal processing circuit 16 comprises two blocks 16a and 16b, which determine signs of the inphase component Sign(Sig I) and the quadrature component Sign(Sig Q). A comparator 16c then determines whether the polarities of the inphase component and the quadrature component are equal or not. Based on an output of the comparator 16c two multiplexers 16d and 16e can be controlled, which each select between two different inputs depending on the polarity relation. Two blocks 16f and 16g, which are in parallel to the blocks 16a and 16b, determine the magnitudes of the Abs(Sig I)=|I| of the inphase component and Abs(Sig Q)=|Q| of the quadrature component and the summation element 16h provides the sum of the magnitudes |I|+|Q|. The multiplexers 16d and 16e can then select between |I|+|Q| and |I| or |Q|, respectively, based on the control signal from the comparator 16c, i.e. based on whether the polarities are equal, or more generally whether the sign(I)=1 and sign(Q)=1, or sign(I)=−1 and sign(Q)=−1. In case the polarities are equal, |Q| is selected by multiplexer 16e and |I|+|Q| is selected by multiplexer 16d. In case the polarities are not equal |I| is selected by multiplexer 16d and |I|+|Q| is selected by multiplexer 16j. The selected values are then input into two 1D LUTs 16i and 16j, which output the respective pre-distortion coefficients $\alpha_I$ and $\alpha_Q$."

In the example shown in FIG. 6 two 1D LUTs 16i and 16j are shown. In another example a single 1D LUT may be used to determine the respective coefficients based on the input amplitude, cf. FIGS. 3 and 5. In some examples the same 1D LUT may be used to determine the pre-distortion coefficients from. In the example shown in FIG. 6 the signal processing circuit 16 is configured to, in case the polarities of the inphase component and the quadrature component are equal, determine the pre-distortion coefficients from the at least one look-up table 16i, 16j based on a magnitude of the quadrature component and based on a sum of magnitudes of the quadrature component and the inphase component. In case the polarities of the inphase component and the quadrature component are not equal the signal processing circuit 16 is configured to determine the pre-distortion coefficients from the at least one look-up table 16i, 16j based on a magnitude of the inphase component and based on a sum of magnitudes of the quadrature component and the inphase component.

Furthermore, in the example in FIG. 6 the signal processing circuit 16 is configured to determine a pre-distorted version of the inphase component and a pre-distorted version of the quadrature component. This is implemented using two multipliers 16k and 16l. Multiplier 16k determines $\alpha_I I$ based on the inphase component I and $\alpha_I$. Multiplier 16l determines $\alpha_Q Q$ based on the quadrature component Q and $\alpha_Q$. Two adders 16m and 16n then determine pre-distorted versions of the inphase component and the quadrature component, namely I+$\alpha_Q$ Q as pre-distorted version of the inphase signal and Q−$\alpha_I$ I as pre-distorted quadrature component. The pre-distorted version of the inphase component is an addition of the inphase component and the quadrature component weighted with the predistortion coefficient. The pre-distorted version of the quadrature component is an addition of the quadrature component and the inphase component weighted with the pre-distortion coefficient.

Figure 7:
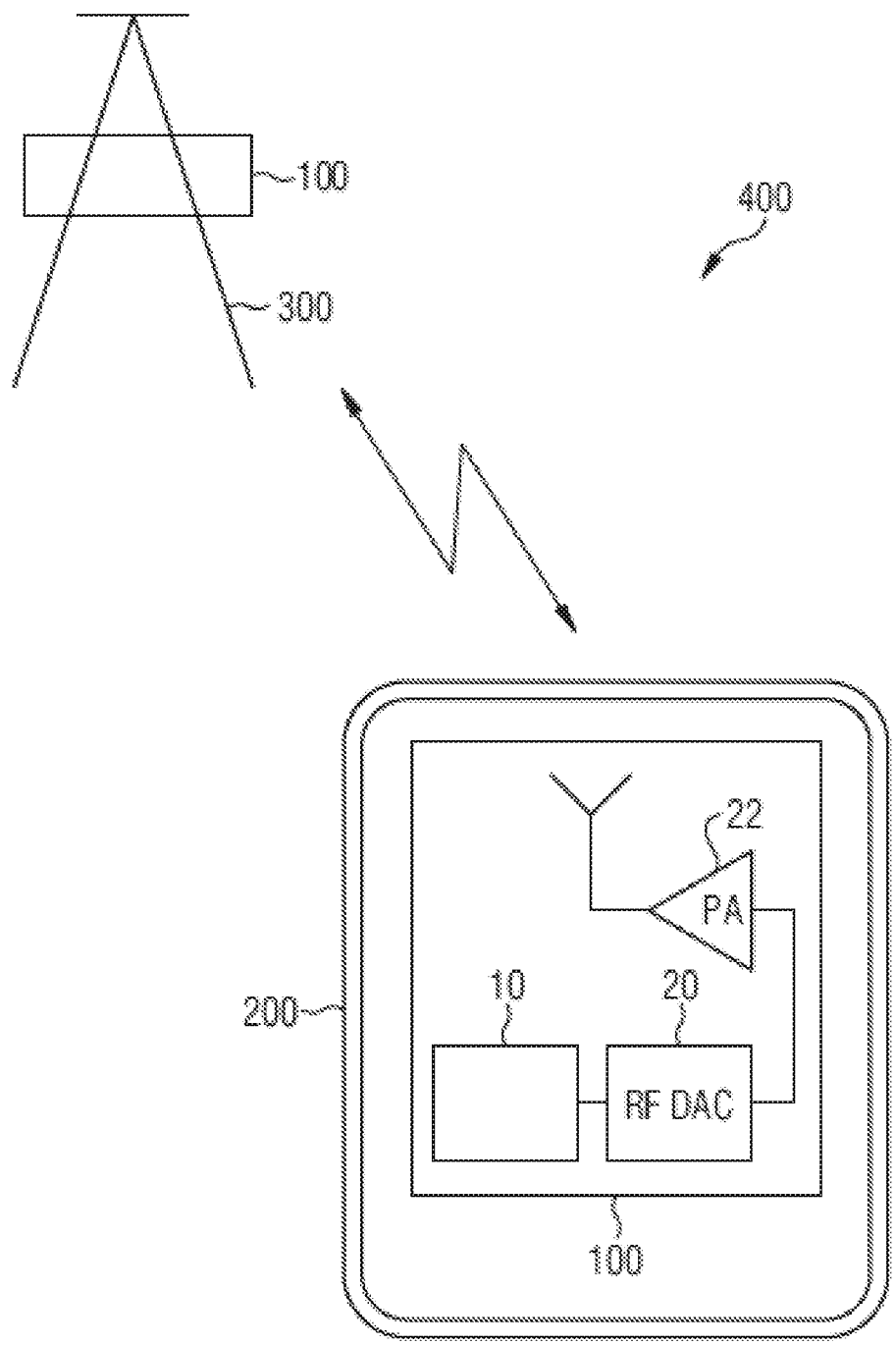
FIG. 7 illustrates examples of a mobile communication system, a mobile transceiver, and a base station transceiver.

Summarizing the example shown in FIG. 6 first amplitudes of the I and Q signals are added 16f, 16g, 16h and the signs are compared 16a, 16b, 16c. If the signs are equal then as an input of the 1D LUT 16i, 16j yields |I|+|Q| and |Q|. If the signs are not equal the inputs are |I| and |I|+|Q|. The 1D LUT is designed according to the measured AMPM behavior and it is approximated as linear function. Calculated coefficients are then multiplied with signals in I and Q and added to the signals as represented in FIG. 7. In an example of a transmitter 100 the pre-distorted versions of the inphase and quadrature components are then provided to an RFDAC for analog-to-digital conversion and conversion to the transmission band. In another example four LUTs may be used depending on the four sign combinations.

Another example of a transmitter 100 is illustrated in FIG. 7. The transmitter comprises an example of the pre-distortion circuit as shown in FIG. 6 and an RFDAC 20. The output of the RFDAC is provided to a Power Amplifier 22 before the signal is being transmitted. It is to be noted that the transmitter may comprise further components, such as one or more filters, diplexers, duplexers, antennas, etc. Such a transmitter 100 may be comprised in a radio transceiver, such as a mobile transceiver 200 or base station transceiver 300. Examples also provide a communication device comprising the radio transceiver. FIG. 7 illustrates examples of a mobile communication system 400, a mobile transceiver 200, and a base station transceiver 300. Examples also provide a mobile communication system 400 comprising a mobile transceiver 200 and a base station transceiver 300 as also illustrated by FIG. 7.

The mobile communication system 400 may correspond, for example, to one of the Third Generation Partnership Project (3GPP)-standardized mobile communication networks, where the term mobile communication system is used synonymously to mobile communication network. The mobile or wireless communication system may correspond to a mobile communication system of the 5th Generation (5G) and may use mm-Wave technology. The mobile communication system may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Interoperability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station or base station transceiver 300 can be operable to communicate with one or more active mobile transceivers 200 and a base station transceiver 300 can be located in or adjacent to a coverage area of another base station transceiver, e.g. a macro cell base station transceiver or small cell base station transceiver. Hence, examples may provide a mobile communication system 400 comprising one or more mobile transceivers 200 and one or more base station transceivers 300, wherein the base station transceivers 300 may establish macro cells or small cells, as e.g. pico-, metro-, or femto cells. A mobile transceiver 200 may correspond to a smartphone, a cell phone, user equipment, a laptop, a notebook, a personal computer, a Personal Digital Assistant (PDA), a Universal Serial Bus (USB)-stick, a car, etc. A mobile transceiver 200 may also be referred to as User Equipment (UE) or mobile in line with the 3GPP terminology.

A base station transceiver 300 can be located in the fixed or stationary part of the network or system. A base station transceiver 300 may correspond to a remote radio head, a transmission point, an access point, a macro cell, a small cell, a micro cell, a femto cell, a metro cell etc. A base station transceiver 300 can be a wireless interface of a wired network, which enables transmission of radio signals to a UE or mobile transceiver 200. Such a radio signal may comply with radio signals as, for example, standardized by 3GPP or, generally, in line with one or more of the above listed systems. Thus, a base station transceiver 300 may correspond to a NodeB, an eNodeB, a Base Transceiver Station (BTS), an access point, a remote radio head, a transmission point etc., which may be further subdivided in a remote unit and a central unit.

Figure 8:
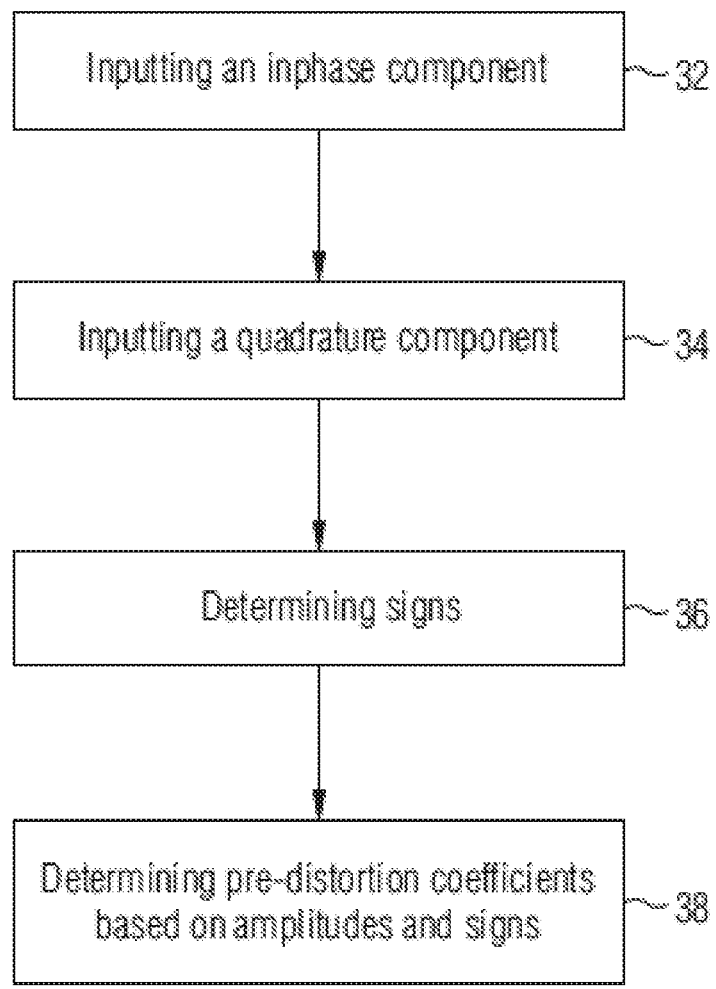
FIG. 8 shows a block diagram of an example of a method for pre-distorting.

FIG. 8 shows a block diagram of an example of a method for pre-distorting. The predistortion method is configured for a digital quadrature signal. The pre-distortion method comprises inputting 32 an inphase component of the quadrature signal and inputting 34 a quadrature component of the quadrature signal. The method further comprises determining 36 the signs of the inphase component and of the quadrature component. The method comprises determining 38 pre-distortion coefficients based on the amplitude of the inphase component, the amplitude of the quadrature component, and based on the signs of the inphase component and the quadrature component.

Another example is a computer program having a program code for performing at least one of the above methods, when the computer program is executed on a computer, a processor, or a programmable hardware component. Yet another example is a computer readable storage medium storing instructions which, when executed by a computer, processor, or programmable hardware component, cause the computer to implement one of the methods described herein.

The examples as described herein may be summarized as follows:

A first example is a pre-distortion circuit 10 for a digital quadrature signal. The predistortion circuit 10 comprises a first input 12 for an inphase component of the quadrature signal, and a second input 14 for a quadrature component of the quadrature signal. The predistortion circuit 10 further comprises a signal processing circuit 16 configured to determine the signs of the inphase component and of the quadrature component, and to determine predistortion coefficients based on the amplitude of the inphase component, the amplitude of the quadrature component, and based on the signs of the inphase component and the quadrature component.

In example 2 the pre-distortion circuit 10 of example 1 comprises a generation module 18 configured to generate the pre-distortion coefficients.

Example 3 is the pre-distortion circuit 10 of example 2, wherein the generation module 18 is a storage module configured to store at least one one-dimensional look-up table, and wherein the at least one look-up table comprises a mapping between amplitude values and predistortion coefficients or wherein the at least one look-up table comprises a mapping between a number of activated cells in a radio-frequency-digital-to-analog converter and predistortion coefficients, the radio-frequency-digital-to-analog converter being configured to convert the inphase component or the quadrature component.

Example 4 is the pre-distortion circuit 10 of example 3, wherein the signal processing circuit 16 is configured to determine a pre-distortion coefficient from the at least one look-up table based on a magnitude of the quadrature component in case the polarities are equal and wherein the signal processing circuit 16 is configured to determine a pre-distortion coefficient from the at least one look-up table based on a magnitude of the inphase component in case the polarities are different.

Example 5 is the pre-distortion circuit 10 of one of the examples 3 or 4, wherein the at least one look-up table comprises an approximation of a rotation of a polar representation of the quadrature signal to the inphase and quadrature components.

Example 6 is the pre-distortion circuit 10 of example 5, wherein the at least one look-up table comprises an approximation assuming non-orthogonal rotations of the polar representation to obtain the inphase and quadrature components.

Example 7 is the pre-distortion circuit 10 of one of the examples 5 or 6, wherein the approximation is linear.

Example 8 is the pre-distortion circuit 10 of one of the examples 3 to 7, wherein the signal processing circuit 16 is configured to determine pre-distortion coefficients from the at least one look-up table based on a magnitude of the quadrature component and based on a sum of magnitudes of the quadrature component and the inphase component.

Example 9 is the pre-distortion circuit 10 of one of the examples 3 to 8, wherein the signal processing circuit 16 is configured to determine the pre-distortion coefficients from the at least one look-up table based on a magnitude of the inphase component and based on a sum of magnitudes of the quadrature component and the inphase component.

Example 10 is the pre-distortion circuit 10 of one of the examples 3 to 9, wherein the signal processing circuit 16 is configured to, in case the polarities of the inphase component and the quadrature component are equal, determine the pre-distortion coefficients from the at least one look-up table based on a magnitude of the quadrature component and based on a sum of magnitudes of the quadrature component and the inphase component, and, in case the polarities of the inphase component and the quadrature component are not equal, determine the pre-distortion coefficients from the at least one look-up table based on a magnitude of the inphase component and based on a sum of magnitudes of the quadrature component and the inphase component.

Example 11 is the pre-distortion circuit 10 of one of the examples 1 to 10, wherein the signal processing circuit 16 is configured to determine a pre-distorted version of the inphase component and a pre-distorted version of the quadrature component.

Example 12 is the pre-distortion circuit 10 of example 11, wherein the pre-distorted version of the inphase component is an addition of the inphase component and the quadrature component weighted with the pre-distortion coefficient.

Example 13 is the pre-distortion circuit 10 of one of the examples 1 to 12, wherein the predistorted version of the quadrature component is an addition of the quadrature component and the inphase component weighted with the pre-distortion coefficient.

Example 14 is a pre-distortion apparatus 10 for a digital quadrature signal. The predistortion apparatus 10 comprises a first input 12 for an inphase component of the quadrature signal, and a second input 14 for a quadrature component of the quadrature signal. The pre-distortion apparatus 10 comprises signal processing means 16 configured for determining signs of the inphase component and of the quadrature component, and for determining pre-distortion coefficients based on the amplitude of the inphase component, the amplitude of the quadrature component, and based on the signs of the inphase component and the quadrature component.

Example 15 is the pre-distortion apparatus 10 of example 14, comprising a generation means 18 configured for generating the pre-distortion coefficients.

Example 16 is the pre-distortion apparatus 10 of example 15, wherein the generation means 18 comprises storing means configured for storing at least one one-dimensional look-up table, and wherein the at least one look-up table comprises a mapping between amplitude values and pre-distortion coefficients or wherein the at least one look-up table comprises a mapping between a number of activated cells in a radio-frequency-digital-to-analog converter and pre-distortion coefficients, the radio-frequency-digital-to-analog converter being configured for converting the inphase component or the quadrature component.

Example 17 is the pre-distortion apparatus 10 of example 16, wherein the signal processing means 16 is configured for determining the pre-distortion coefficients from the at least one look-up table based on a magnitude of the quadrature component in case the polarities are equal and wherein the signal processing means 16 is configured for determining the predistortion coefficients from the at least one look-up table based on a magnitude of the inphase component in case the polarities are different.

Example 18 is the pre-distortion apparatus 10 of one of the examples 16 or 17, wherein the at least one look-up table comprises an approximation of a rotation of a polar representation of the quadrature signal to the inphase and quadrature components.

Example 19 is the pre-distortion apparatus 10 of example 18, wherein the at least one lookup table comprises an approximation assuming non-orthogonal rotations of the polar representation to obtain the inphase and quadrature components.

Example 20 is the pre-distortion apparatus 10 of one of the examples 18 or 19, wherein the approximation is linear.

Example 21 is the pre-distortion apparatus 10 of one of the examples 16 to 20, wherein the signal processing means 16 is configured for determining the pre-distortion coefficients from the at least one look-up table based on a magnitude of the quadrature component and based on a sum of magnitudes of the quadrature component and the inphase component.

Example 22 is the pre-distortion apparatus 10 of one of the examples 16 to 21, wherein the signal processing means 16 is configured for determining the pre-distortion coefficients from the at least one look-up table based on a magnitude of the inphase component and based on a sum of magnitudes of the quadrature component and the inphase component.

Example 23 is the pre-distortion apparatus 10 of one of the examples 16 to 22, wherein the signal processing means 16 is configured for, in case the polarities of the inphase component and the quadrature component are equal, determining the pre-distortion coefficients from the at least one look-up table based on a magnitude of the quadrature component and based on a sum of magnitudes of the quadrature component and the inphase component, and, in case the polarities of the inphase component and the quadrature component are not equal, determining the pre-distortion coefficients from the at least one look-up table based on a magnitude of the inphase component and based on a sum of magnitudes of the quadrature component and the inphase component.

Example 24 is the pre-distortion apparatus 10 of one of the examples 14 to 23, wherein the signal processing means 16 is configured for determining a pre-distorted version of the inphase component and a pre-distorted version of the quadrature component.

Example 25 is the pre-distortion apparatus 10 of example 24, wherein the pre-distorted version of the inphase component is an addition of the inphase component and the quadrature component weighted with the pre-distortion coefficient.

Example 26 is the pre-distortion apparatus 10 of one of the examples 14 to 25, wherein the pre-distorted version of the quadrature component is an addition of the quadrature component and the inphase component weighted with the pre-distortion coefficient.

Example 27 is a transmitter 100 comprising the pre-distortion circuit 10 of any of the examples 1 to 13 or the pre-distortion apparatus 10 of any of the examples 14 to 26, and a radiofrequency-digital-to-analog converter 20 configured for converting a base band signal to an analog radio frequency signal based an output signal of the pre-distortion circuit 10.

Example 28 is the transmitter 100 of example 27, wherein the radio-frequency-digital-to-analog converter is a capacitive digital-to-analog converter.

Example 29 is a radio transceiver comprising the transmitter 100 of one of the examples 27 or 28.

Example 30 is a mobile transceiver 200 comprising the radio transceiver of example 29.

Example 31 is a base station transceiver 300 comprising the radio transceiver of example 29.

Example 32 is a pre-distortion method for a digital quadrature signal. The pre-distortion method comprises inputting 32 an inphase component of the quadrature signal and inputting a 34 quadrature component of the quadrature signal. The method comprises determining 36 signs of the inphase component and of the quadrature component, and determining 38 predistortion coefficients based on the amplitude of the inphase component, the amplitude of the quadrature component, and based on the signs of the inphase component and the quadrature component.

Example 33 is the pre-distortion method of example 32, comprising generating 18 the predistortion coefficients.

Example 34 is the pre-distortion method of example 33, wherein the generating (18) comprises storing at least one one-dimensional look-up table, and wherein the at least one lookup table comprises a mapping between amplitude values and pre-distortion coefficients or wherein a at least one look-up table comprises a mapping between a number of activated cells in a radio-frequency-digital-to-analog converter and pre-distortion coefficients, the radio-frequency-digital-to-analog converter being configured for converting the inphase component or the quadrature component.

Example 35 is the pre-distortion method of example 34, comprising determining a predistortion coefficient from the at least one look-up table based on a magnitude of the quadrature component in case the polarities are equal, determining a pre-distortion coefficient from the at least one look-up table based on a magnitude of the inphase component in case the polarities are different.

Example 36 is the pre-distortion method of one of the examples 34 or 35, wherein the at least one look-up table comprises an approximation of a rotation of a polar representation of the quadrature signal to the inphase and quadrature components.

Example 37 is the pre-distortion method of example 36, wherein the at least one look-up table comprises an approximation assuming non-orthogonal rotations of the polar representation to obtain the inphase and quadrature components.

Example 38 is the pre-distortion method of one of the examples 36 or 37, wherein the approximation is linear.

Example 39 is the pre-distortion method of one of the examples 34 to 38, comprising determining the pre-distortion coefficients from the at least one look-up table based on a magnitude of the quadrature component and based on a sum of magnitudes of the quadrature component and the inphase component.

Example 40 is the pre-distortion method of one of the examples 34 to 39, comprising determining the pre-distortion coefficients from the at least one look-up table based on a magnitude of the inphase component and based on a sum of magnitudes of the quadrature component and the inphase component.

Example 41 is the pre-distortion method of one of the examples 34 to 40, comprising, in case the polarities of the inphase component and the quadrature component are equal, determining the pre-distortion coefficients from the at least one look-up table based on a magnitude of the quadrature component and based on a sum of magnitudes of the quadrature component and the inphase component, and, in case the polarities of the inphase component and the quadrature component are not equal, determining the pre-distortion coefficients from the at least one look-up table based on a magnitude of the inphase component and based on a sum of magnitudes of the quadrature component and the inphase component.

Example 42 is the pre-distortion method of one of the examples 32 to 43, comprising determining a pre-distorted version of the inphase component and a pre-distorted version of the quadrature component.

Example 43 is the pre-distortion method of example 42, wherein the pre-distorted version of the inphase component is an addition of the inphase component and the quadrature component weighted with the pre-distortion coefficient.

Example 44 is the pre-distortion method of one of the examples 32 to 43, wherein the predistorted version of the quadrature component is an addition of the quadrature component and the inphase component weighted with the pre-distortion coefficient.

Example 45 is a computer program having a program code for performing the method of at least one of the examples 32 to 44, when the computer program is executed on a computer, a processor, or a programmable hardware component.

Example 46 is a machine readable storage including machine readable instructions, when executed, to implement a method or realize an apparatus as exemplified in any pending example.

Example 47 is a machine readable medium including code, when executed, to cause a machine to perform the method of any one of examples 42 to 44.

Example 48 is a communication device comprising the radio transceiver of example 29.

A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, exemplify the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for controlling", "signal processing means", "means for storing", "means for inputting", etc., may be provided through the use of dedicated hardware, such as "a controller", "a processor", "a storage or a memory", "an input", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry exemplify the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A pre-distortion circuit for a digital quadrature signal, the pre-distortion circuit comprising:
    a first input for an inphase component of the quadrature signal;
    a second input for a quadrature component of the quadrature signal;
    signal processing circuit configured to
        determine signs of the inphase component and of the quadrature component;
        determine pre-distortion coefficients based on an amplitude of the inphase component, an amplitude of the quadrature component, and based on the signs of the inphase component and the quadrature component.

2. The pre-distortion circuit of claim 1, comprising a generation module configured to generate the pre-distortion coefficients.

3. The pre-distortion circuit of claim 2, wherein the generation module is a storage module configured to store at least one one-dimensional look-up table, and wherein the at least one look-up table comprises a mapping between amplitude values and pre-distortion coefficients or wherein the at least one look-up table comprises a mapping between a number of activated cells in a radio-frequency-digital-to-analog converter and pre-distortion coefficients, the radio-frequency-digital-to-analog converter being configured to convert the inphase component or the quadrature component.

4. The pre-distortion circuit of claim 3, wherein the signal processing circuit is configured to determine a pre-distortion coefficient from the at least one look-up table based on a magnitude of the quadrature component in case the polarities are equal and wherein the signal processing circuit is configured to determine a pre-distortion coefficient from the at least one look-up table based on a magnitude of the inphase component in case the polarities are different.

5. The pre-distortion circuit of claim 3, wherein the at least one look-up table comprises an approximation of a rotation of a polar representation of the quadrature signal to the inphase and quadrature components.

6. The pre-distortion circuit of claim 5, wherein the at least one look-up table comprises an approximation assuming non-orthogonal rotations of the polar representation to obtain the inphase and quadrature components.

7. The pre-distortion circuit of claim 5, wherein the approximation is linear.

8. The pre-distortion circuit of claim 3, wherein the signal processing circuit is configured to determine the pre-distortion coefficients from the at least one look-up table based on a magnitude of the quadrature component and based on a sum of magnitudes of the quadrature component and the inphase component.

9. The pre-distortion circuit of claim 3, wherein the signal processing circuit is configured to determine the pre-distortion coefficients from the at least one look-up table based on a magnitude of the inphase component and based on a sum of magnitudes of the quadrature component and the inphase component.

10. The pre-distortion circuit of claim 3, wherein the signal processing circuit is configured to
    in case polarities of the inphase component and the quadrature component are equal
        determine the pre-distortion coefficients from the at least one look-up table based on a magnitude of the quadrature component and based on a sum of magnitudes of the quadrature component and the inphase component, and
    in case the polarities of the inphase component and the quadrature component are not equal
        determine the pre-distortion coefficients from the at least one look-up table based on a magnitude of the inphase component and based on a sum of magnitudes of the quadrature component and the inphase component.

11. The pre-distortion circuit of claim 3, wherein the signal processing circuit is configured to determine a pre-distorted version of the inphase component and a pre-distorted version of the quadrature component.

12. The pre-distortion circuit of claim 11, wherein the pre-distorted version of the inphase component is an addition of the inphase component and the quadrature component weighted with the pre-distortion coefficient.

13. The pre-distortion circuit of claim 11, wherein the pre-distorted version of the quadrature component is an addition of the quadrature component and the inphase component weighted with the pre-distortion coefficient.

14. A transmitter comprising the pre-distortion circuit of claim 1 and a radio-frequency-digital-to-analog converter configured for converting a base band signal to an analog radio frequency signal based on an output signal of the pre-distortion circuit.

15. The transmitter of claim 14, wherein the radio-frequency-digital-to-analog converter is a capacitive digital-to-analog converter.

16. A radio transceiver comprising the transmitter of claim 14.

17. A mobile transceiver comprising the radio transceiver of claim 16.

18. A base station transceiver comprising the radio transceiver of claim 16.

19. A communication device comprising the radio transceiver of claim 16.

20. A pre-distortion method for a digital quadrature signal, the pre-distortion method comprising
   inputting an inphase component of the quadrature signal;
   inputting a quadrature component of the quadrature signal;
   determining signs of the inphase component and of the quadrature component;
   determining pre-distortion coefficients based on an amplitude of the inphase component, an amplitude of the quadrature component, and based on the signs of the inphase component and the quadrature component.

21. The pre-distortion method of claim 20, comprising generating the pre-distortion coefficients.

22. The pre-distortion method of claim 21, wherein the generating comprises storing at least one one-dimensional look-up table, and wherein the at least one look-up table comprises a mapping between amplitude values and pre-distortion coefficients or wherein the at least one look-up table comprises a mapping between a number of activated cells in a radio-frequency-digital-to-analog converter and pre-distortion coefficients, the radio-frequency-digital-to-analog converter being configured for converting the inphase component or the quadrature component.

23. The pre-distortion method of claim 22, comprising determining a pre-distortion coefficient from the at least one look-up table based on a magnitude of the quadrature component in case polarities are equal, determining a pre-distortion coefficient from the at least one look-up table based on a magnitude of the inphase component in case the polarities are different.

24. The pre-distortion method of claim 22, wherein the at least one look-up table comprises an approximation of a rotation of a polar representation of the quadrature signal to the inphase and quadrature components.

25. A non-transitory machine readable storage including machine readable instructions which, when executed, implement the pre-distortion method recited in claim 20.

* * * * *